(12) United States Patent
Tsironis

(10) Patent No.: US 9,553,376 B1
(45) Date of Patent: Jan. 24, 2017

(54) COAXIAL ALIGNMENT INSTRUMENT ADAPTER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 14/799,627

(22) Filed: Jul. 15, 2015

Related U.S. Application Data

(60) Provisional application No. 62/030,370, filed on Jul. 29, 2014.

(51) Int. Cl.
*H01R 13/64* (2006.01)
*H01R 9/05* (2006.01)

(52) U.S. Cl.
CPC .................................. *H01R 9/0524* (2013.01)

(58) Field of Classification Search
CPC .............................. H01R 9/0524; H01R 13/64
USPC .......................... 439/374, 322, 323, 320, 312
See application file for complete search history.

(56) References Cited

U.S. PATENT DOCUMENTS

| | | | | | |
|---|---|---|---|---|---|
| 5,342,218 | A * | 8/1994 | McMills | ............... | H01R 9/0521 439/374 |
| 5,576,935 | A * | 11/1996 | Freer | ...................... | G06F 1/184 211/41.17 |
| 6,174,206 | B1 * | 1/2001 | Yentile | .................. | H01R 24/542 439/578 |
| 6,361,351 | B1 * | 3/2002 | Fujii | ...................... | H01R 13/74 439/374 |
| 6,808,407 | B1 * | 10/2004 | Cannon | ................ | H01R 13/625 439/314 |
| 7,479,033 | B1 * | 1/2009 | Sykes | .................. | H01R 9/0518 439/578 |
| 7,938,663 | B2 * | 5/2011 | Leipold | ................... | H01R 9/05 439/322 |
| 8,419,468 | B2 * | 4/2013 | Alrutz | .................. | H01R 13/622 439/321 |
| 2005/0140459 | A1 * | 6/2005 | Tanbakuchi | ............ | H01P 1/045 333/4 |
| 2010/0261380 | A1 * | 10/2010 | Skeels | .................. | H01R 9/0524 439/584 |
| 2011/0143575 | A1 * | 6/2011 | Meynier | ............... | H01R 13/622 439/370 |
| 2011/0312199 | A1 * | 12/2011 | Alrutz | .................. | H01R 13/622 439/188 |
| 2012/0212306 | A1 * | 8/2012 | Richley | ..................... | H01P 1/30 333/24 R |

(Continued)

OTHER PUBLICATIONS

Wikipedia, SMA coaxial; https://en.wikipedia.org/wiki/SMA_connector.

(Continued)

*Primary Examiner* — Abdullah Riyami
*Assistant Examiner* — Nader Alhawamdeh

(57) ABSTRACT

An adapter alignment device, that can be added on the coaxial RF connectors of instruments, especially slide screw impedance tuners, aligns and guides precisely and repeatably the male and female adapters into each-other. This leaves the internal center conductors of the tuner slabline, which are attached to the connectors and to external manually handled cables, intact; this is crucial for all instruments, most of all electro-mechanical impedance tuners, where data generated by previous calibrations are used in later measurement and where any other type of numeric adapter error correction or error model is impossible.

8 Claims, 11 Drawing Sheets

(56) References Cited

U.S. PATENT DOCUMENTS

| | | | | |
|---|---|---|---|---|
| 2013/0029522 A1* | 1/2013 | Holliday | ............... | H01R 9/05 439/584 |
| 2013/0090010 A1* | 4/2013 | Darrow | ............... | H02H 9/06 439/620.03 |
| 2013/0143439 A1* | 6/2013 | Nugent | ............... | H01R 9/0518 439/585 |
| 2013/0330967 A1* | 12/2013 | Youtsey | ............... | H01R 9/0524 439/584 |
| 2014/0106613 A1* | 4/2014 | Burris | ............... | H01R 9/0524 439/578 |
| 2014/0106614 A1* | 4/2014 | Burris | ............... | H01R 9/0527 439/578 |

OTHER PUBLICATIONS

Precision 3.5mm (APC3.5) Coaxial Connector, Maury Microwave, Datasheet 5E-062, Mar. 2013.
Tru Corporation, 2.9mm coaxial connector; http://www.trucorporation.com/products/rf_connectors/interfaces/29_mm/.
SRI Connector Gage Company, Custom and Standard 2.4mm coaxial connector; http://www.sriconnectorgage.com/products.aspx?c=28.
1.8mm (V) connector Specifications; http://mpd.southwestmicrowave.com/products/family.php?family=237.
DC to 110 GHz Measurements in Coaxial using the 1mm connector, Microwave Journal Article; http://www.microwavejournal.com/articles/2674-dc-to-110-ghz-measurement.
SMK Connectors and Specifications.
DUT VSWR and DUT Rmin vs Fixture Loss, Figure 1; http://www.focus-microwaves.com/formulas.

* cited by examiner

FIG.5, see ref. 7

COAXIAL ALIGNMENT INSTRUMENT ADAPTER

PRIORITY CLAIM

This application claims priority on provisional application 62/030,370, filed on Jul. 29, 2014, titled "COAXIAL ALIGNMENT INSTRUMENT ADAPTER".

CROSS-REFERENCE TO RELATED ARTICLES

1. Wikipedia, SMA coaxial; https://en.wikipedia.org/wiki/SMA_connector
2. Precision 3.5 mm (APC3.5) Coaxial Connector, Maury Microwave, Datasheet 5E-062, March 2013
3. Tru Corporation, 2.9 mm coaxial connector; http://www.trucorporation.com/products/rf_connectors/interfaces/29_mm/
4. SRI Connector Gage Company, Custom and Standard 2.4 mm coaxial connector; http://www.sriconnectorgage.com/products.aspx?c=28
5. 1.8 mm (V) connector Specifications; http://mpd.southwestmicrowave.com/products/family.php?family=237
6. DC to 110 GHz Measurements in Coaxial using the 1 mm connector, Microwave Journal Article; http://www.microwavejournal.com/articles/2674-dc-to-110-ghz-measurement
7. SMK Connectors and Specifications
8. DUT VSWR and DUT Rmin vs Fixture Loss, FIG. 1; http://www.focus-microwaves.com/formulas

BACKGROUND OF THE INVENTION

Prior Art

This invention relates to RF instrumentation using small coaxial connectors, such as type SMA (see ref. 1), 3.5 mm (see ref. 2), 2.9 mm (see ref. 3), 2.4 mm (see ref. 4), 1.8 mm (see ref. 5) and 1.0 mm (see ref. 6) coaxial connectors, operating typically at frequencies between 18 GHz and 110 GHz. The smaller the connector size the higher the cut-off frequency.

In general test instruments are equipped with such connectors, depending on the frequency range. Then some kind of RF cable is connected that leads to the device under test (DUT) or other instruments. However, because of the small dimensions and the usual techniques to mount and hold the center pin of the coaxial connector, misalignment is possible and is rather the rule than the exception. The result is lack of repeatability of the connection and excessive wear and tear. The connector misalignment can be improved by proper alignment and guidance of the two mating parts (male-female) of the connector.

In the case of automated slide screw impedance tuners the drawback is worse: first of all such tuners are used in "calibrated" state: i.e. they are first characterized on a vector network analyzer, whereby the tuning probe is placed very close to the central conductor of the slabline (FIG. 2) and s-parameters are measured and saved for a multitude of such probe positions; then the tuners are installed in a test setup and the saved positions are recalled from data memory and RF measurements are made and associated with the originally measured (and saved) s-parameters; if anything changes (mechanically) in-between calibration and measurement operations, the measurement is flawed.

The center conductor of the slotted coaxial airline or slabline used in the tuner forms also the extension of the center pin of the coaxial connector which is held in place by a small dielectric washer. No further support of the center conductor is recommended since it would increase insertion loss. This is necessary in order to minimize the length of transmission line between DUT test port and tuner reflection probe. Using a cascade of several washers would allow additional support of the center conductor, to make it less sensitive to external stress and would improve the mechanical stability; however this technique is avoided because it will introduce additional insertion loss and reduce the tuning range of the tuners (see ref. 8, showing the effect of insertion loss between DUT and tuner on effective tuner VSWR—or tuning range). A different method for preventing the center conductor of the slabline to be displaced by inserting an external connector is therefore required; such a method is the subject of this invention.

SUMMARY OF THE INVENTION

The invention discloses a device which can be attached and adjusted on RF adapters of instruments and in particular on the sidewalls of electro-mechanical slide screw impedance tuners and precisely guide external adapters to connect with the tuner or instrument's coaxial connectors repeatedly. Whereas perfect alignment between the tuner connector pins (male or female) with the mating pins of the external adapters, is always desirable but not always achievable, the proposed solution guarantees that the connections of external adapters with the tuner connectors will be repeatable, i.e. the tuner connector pins will find themselves at the same positions during tuner calibration and tuner operation and will, as a consequence, enhance the tuning repeatability, which is the direct result of mechanical repeatability.

DESCRIPTION OF THE DRAWINGS

The invention and its mode of operation will be more clearly understood from the following detailed description when read with the appended drawings in which.

DETAILED DESCRIPTION OF THE INVENTION

Figure 1:
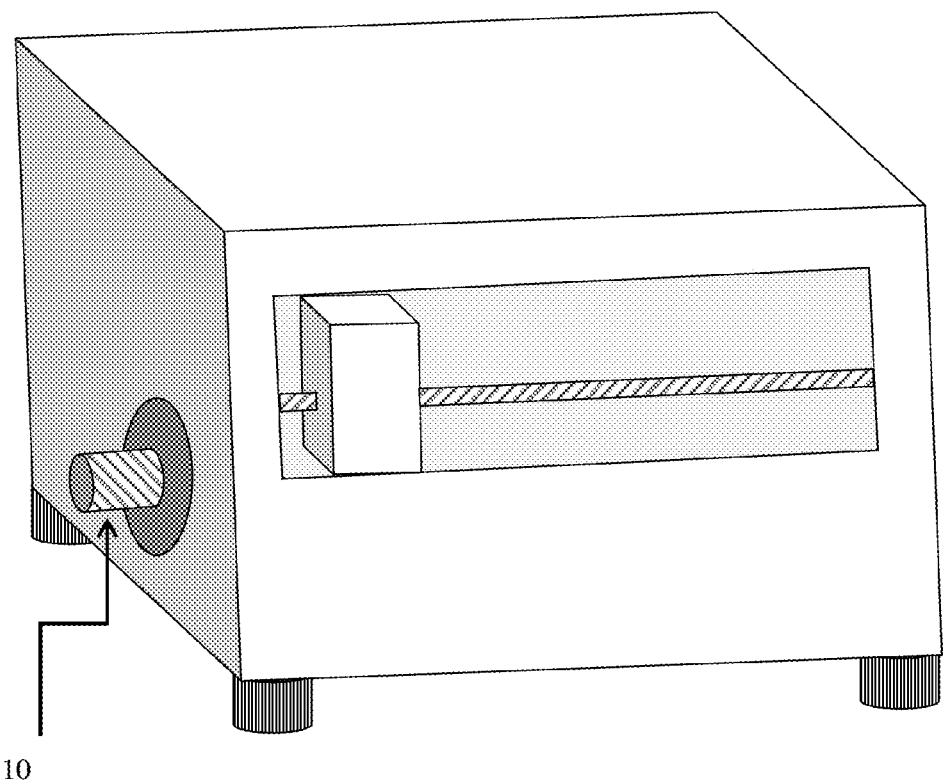
FIG. 1 depicts prior art, a typical automated slide screw impedance tuner, with the arrow pointing to the test port coaxial connector.
Figure 2:
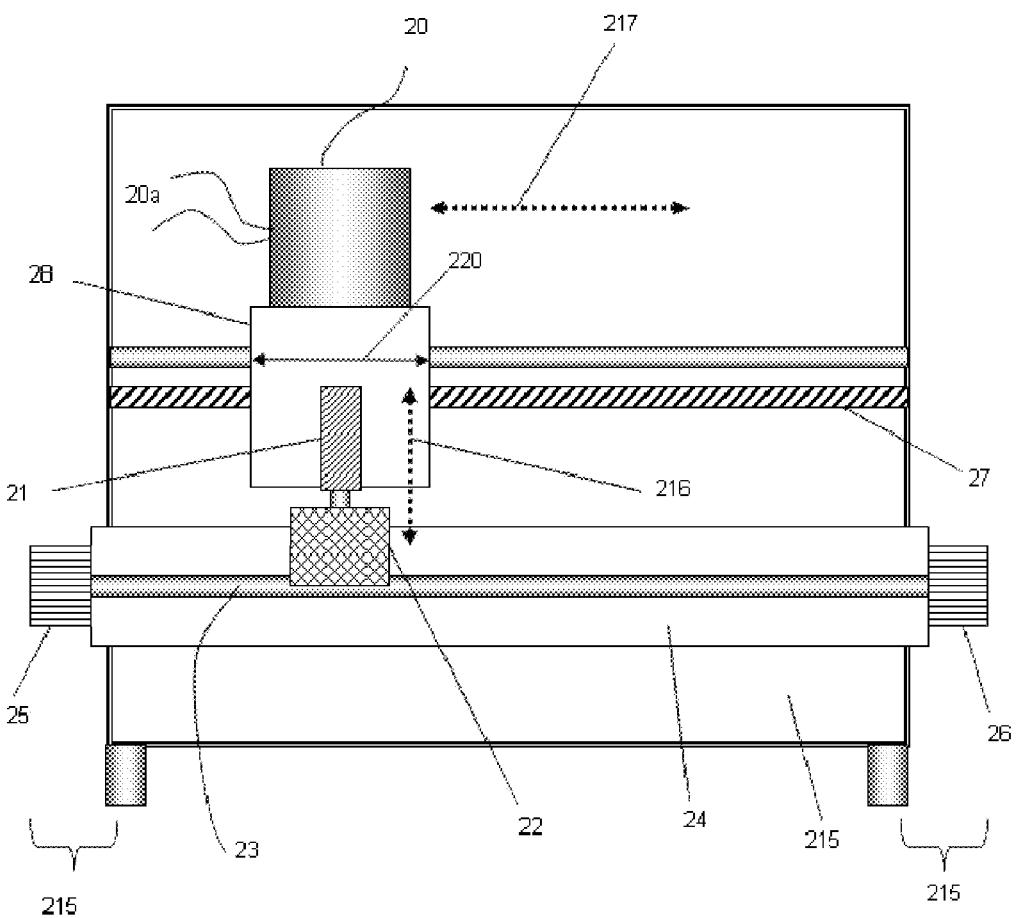
FIG. 2 depicts prior art, a front view of the internal structure and movement control of an automated slide screw impedance tuner using a single vertical axis and RF probe (slug).
Figure 3:
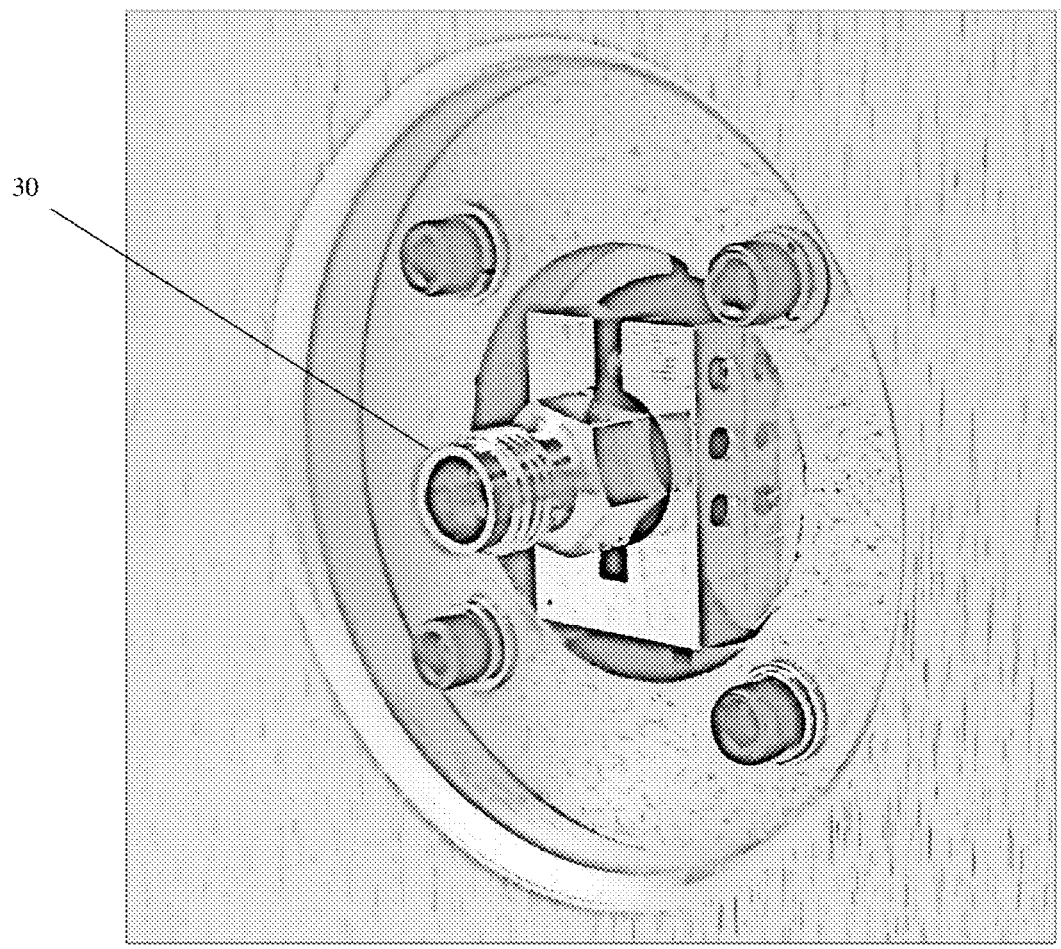
FIG. 3 depicts prior art, a detailed view of the coaxial test port connector of the tuner in FIG. 1.
Figure 4:
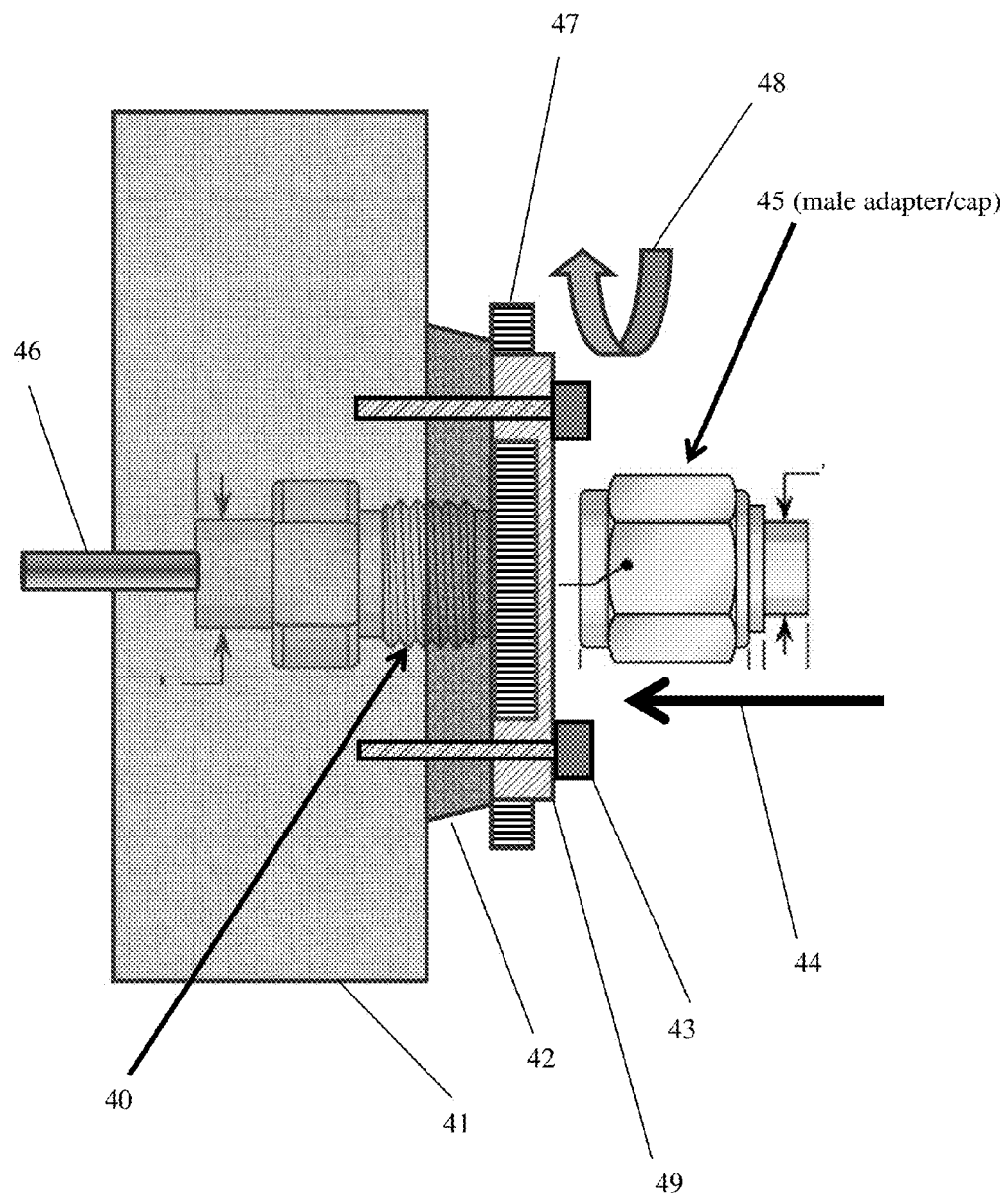
FIG. 4 depicts a detail view of the alignment adapter for a female test port connector.

The alignment adapter comprises 3 main parts (FIGS. 4, 6, 7 and 8): a rectangular or disc formed support body (42), a rectangular cover (49) and (66) and a rotation disc (47) and (60); the support body (42) and the cover (49) are fastened on the sidewall (41) of the tuner or the front panel of a corresponding instrument using four screws (43), (64); the disc (47), (60) can rotate freely sandwiched between the cover (66), (49) and the support body (42). The disc (47), (60) has a central hexagonal opening (61), (80) which matches the hexagonal external cap of the male connector (45). The male connector is inserted sliding into the hexagonal opening (61, 80) and adjusted using the screw (83) to slide-fit snuggly over the male adapter body of the connector. This way the male adapter is guided to mate with the female part (40) and is fastened by hand force only. Hand force is generally sufficient to secure the adapters and allows avoiding the use of torque wrenches. Torque wrenches are used in order to avoid over-torquing the adapters by inexperienced operators. By properly adjusting the fastening screws (43) and aligning the centers or the male and female adapters a good match can be achieved.

A similar situation occurs when a female adapter (76) is inserted into a male instrument adapter (70); in order to align the insertion independently of the operator manhandling it, a coaxial ring (77) is added to the cover (701), slide-fits on the barrel (75) of the adapter and guides (74) the thread of the female adapter into the opening of the male adapter (70). The cover (701) is mounted on the support (72) using fastening screws (73) as in the case of the male-female arrangement. When the thread catches, turning (79) the disc (78), which has the hexagonal opening (80) holding the male adapter (70) will guide the female adapter though and establish reliable and repeatable contact leaving the center conductor (702) intact and in always repeatable position.

Figure 5:
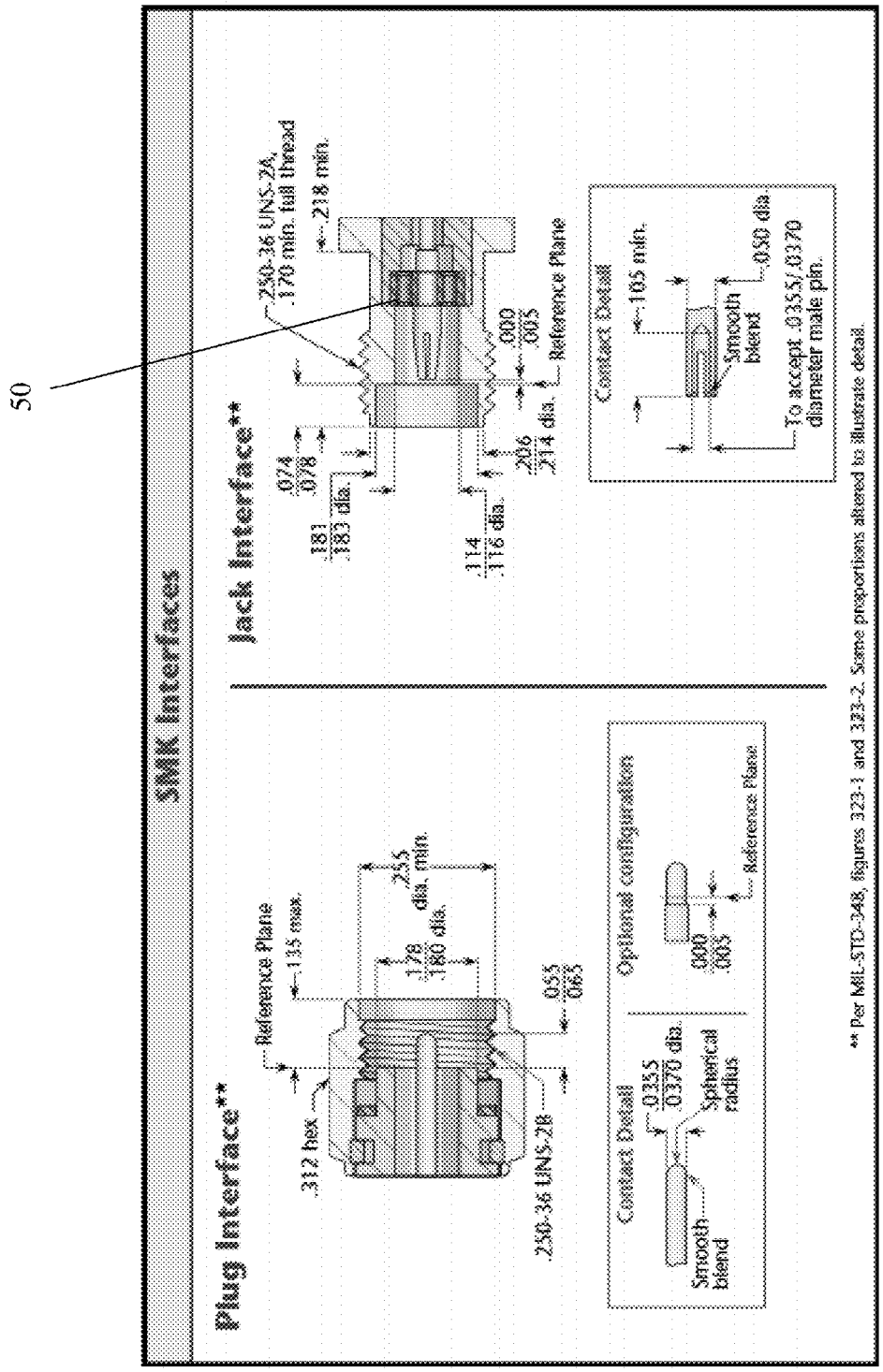
FIG. 5 depicts prior art, dimension details of typical, commercially available, coaxial connectors (see ref.7).
Figure 6:
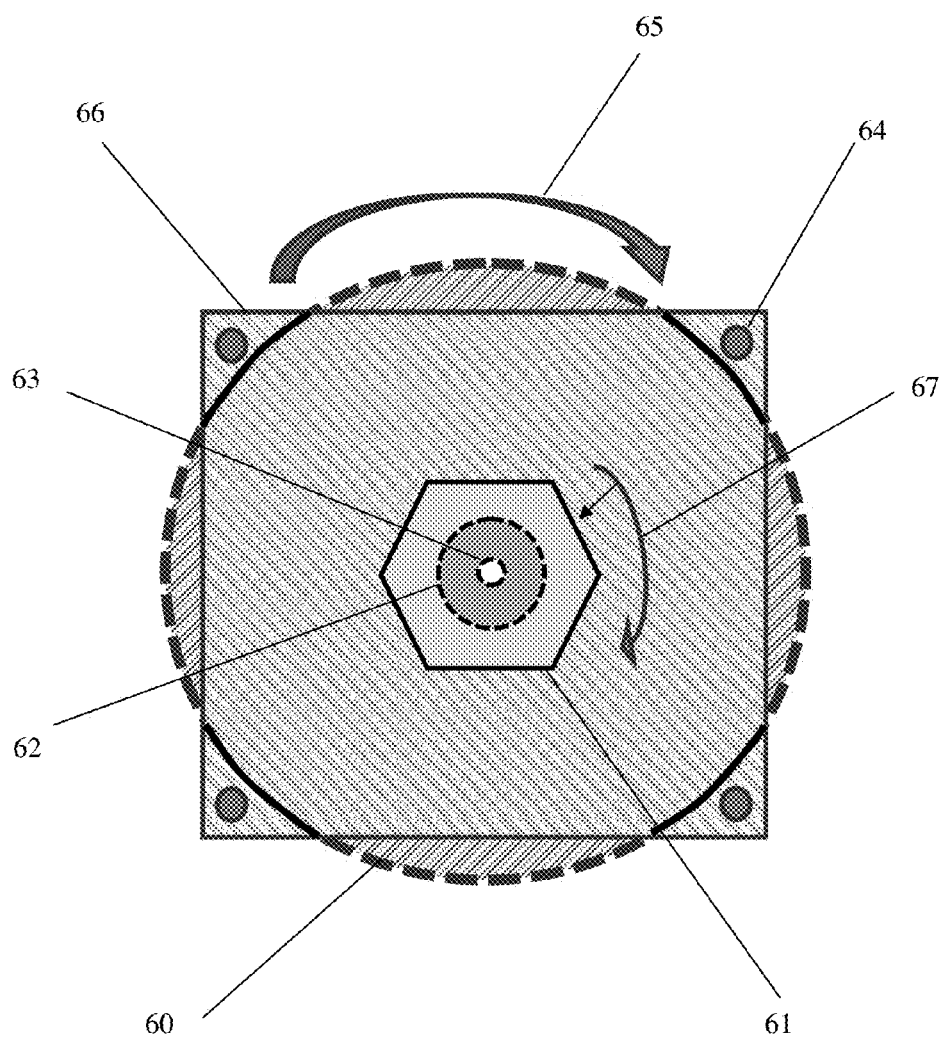
FIG. 6 depicts a front view of the alignment adapter.
Figure 7:
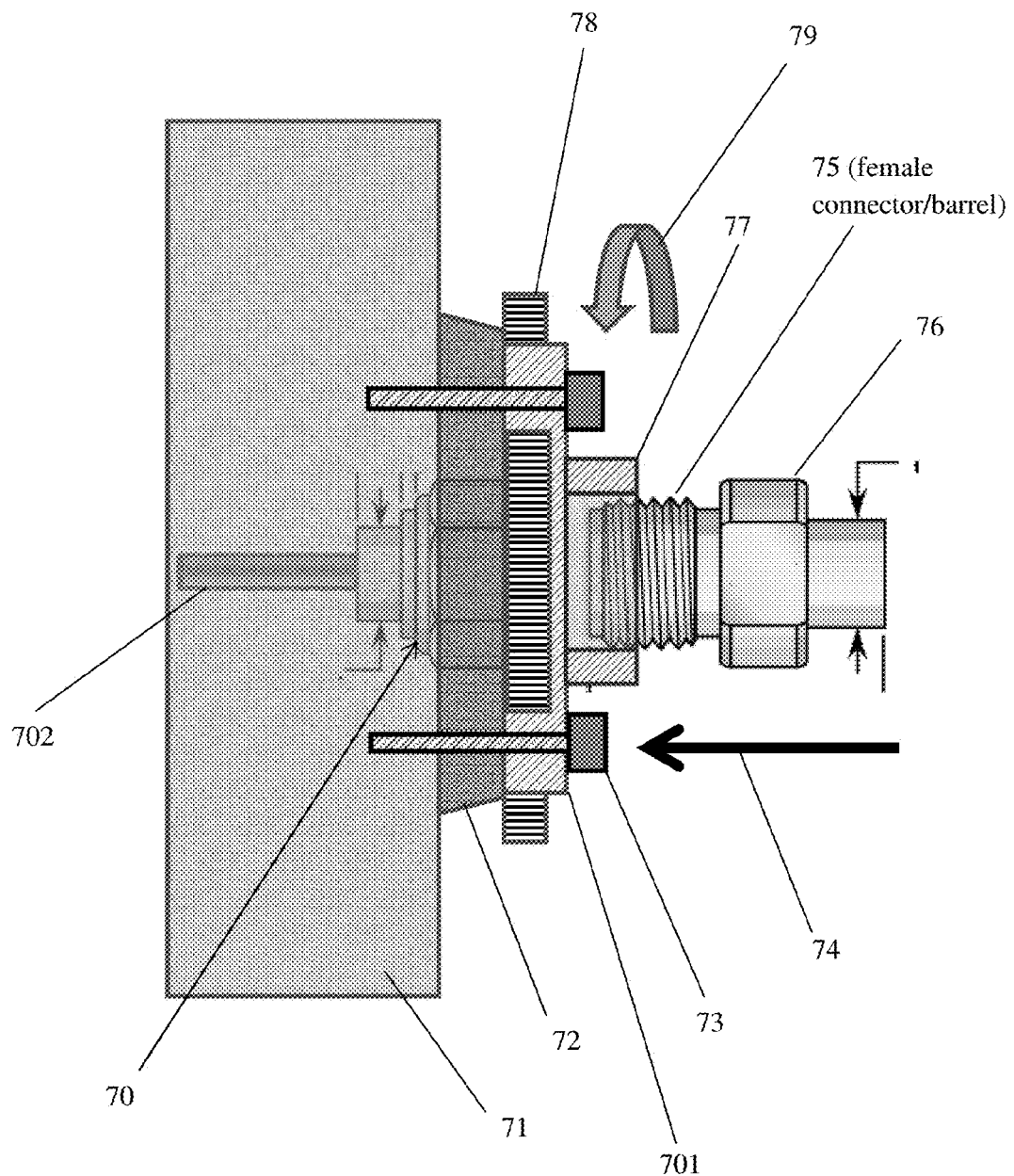
FIG. 7 depicts a detail view of the alignment adapter for a male test port connector.
Figure 8:
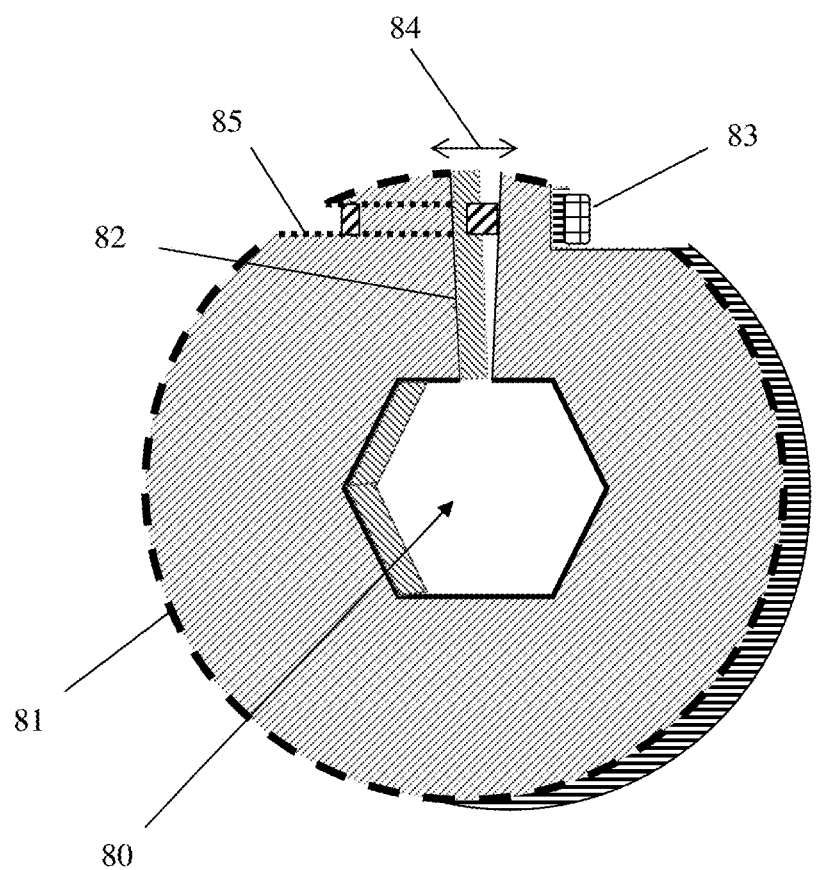
FIG. 8 depicts a front view of the adjustable fastening ring for the male adapter.

The main benefit of this solution is that, during insertion of the male and female connector cores and center pins into each-other a slant position (95) is impossible and thus a dislocation and misguidance of the center conductor of the tuner slabline is avoided. And, even if the male and female (63) center pins are not perfectly aligned (as FIG. 5, see ref.7, shows all parts have certain manufacturing tolerances), at least the alignment adapter (FIGS. 4 and 7) guarantees a repeatable operation. This is important because repeatability of the connector assembly in the case of a tuner, and of most other RF instruments, is as important, or even more important than basic performance itself. For instance, considering that the tuner is calibrated in another setup than it is used in measurement, it is more important to associate the proper impedance (i.e. the value stored in memory during calibration) to a later measured value of RF performance like gain, power etc. than having a better connector match during measurement than during calibration and obtaining a higher maximum tuner reflection factor. If the necessary reflection factor is not reached using the alignment of the available connectors/adapters, the operator knows it and will take action or make the necessary compromise; the measurement will not be (un-intentionally) falsified; if, however, the impedance shown in the test program does not correspond to the real value, because the center conductor (46), (75), (96) has moved between connecting to a Vector Network Analyzer for calibration and connecting to a test fixture and test instruments for actual measurement, then the data collected will be wrong and the whole design process of a RF component (amplifier etc.) will be flawed with unpredictable consequences, time wasted and cost.

In short, the proposed alignment device for adapters helps improving the fidelity of the impedance synthesis operation and thus the reliability of the system.

Figure 9:
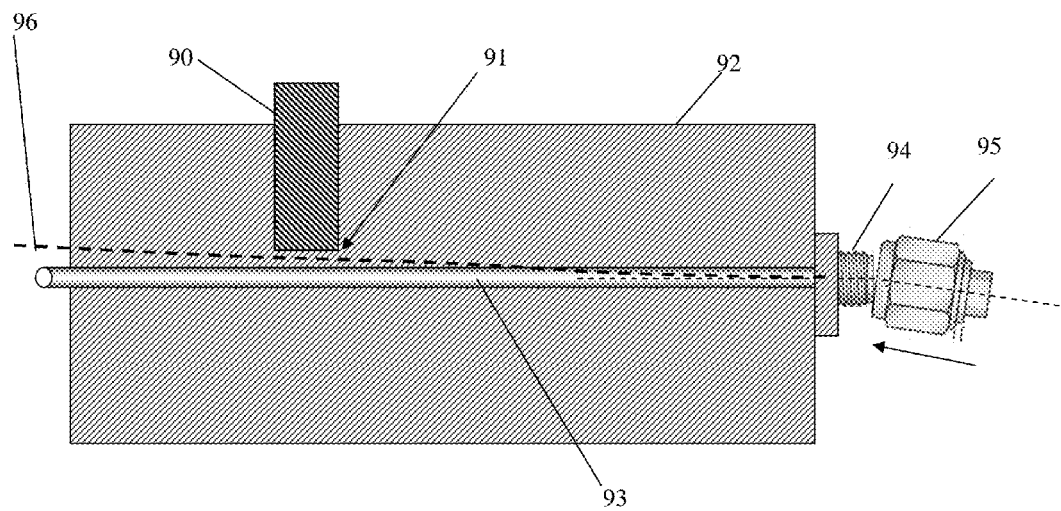
FIG. 9 depicts the misalignment mechanism due to improper mounting of a male adapter and the effect on the center conductor of the slabline.
Figure 10:
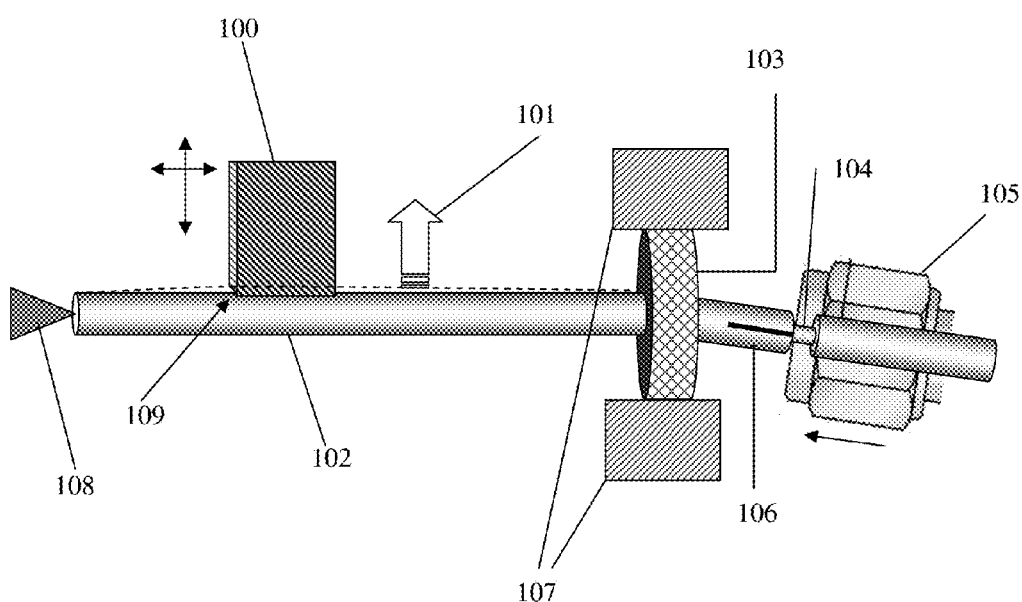
FIG. 10 depicts mechanical detail showing the center conductor displacement mechanism due to false mounting of external coaxial adapter.

The mechanism of misalignment due to the possible connector manual mishandling is shown in FIGS. 9 and 10; this is a typical practical problem with high frequency (>18 GHz) impedance tuners using small RF connectors (see ref. 1 to 6), which are readily available on the market and has not been addressed properly to date: when the male adapter (104) is inserted into the female adapter (106) misaligned, it pushes the center pin (106) of the female adapter down; because of the lever-effect of the dielectric washer (103) used to hold the center pin (106) (FIG. 10) of the female adapter, the center conductor (102) of the slabline is pushed up (101), as shown also in FIG. 9 with the dotted line (96); this means the original gap (91) between the center conductor and the concave bottom of the tuner probe (90), (22) changes and thus the capacitance changes and the reflection factor as well. Considering the actual gap dimensions involved, which vary for gaps between 0.05 mm and 0.1 mm for medium to high reflection factor operations, any small change in the gap (91) will have a large effect and cause reflection factor repeatability error. If the male adapter (95) is not properly guided, it all depends on the care provided by the operator and is thus prone to human error.

The exact mechanics of the center conductor misplacement due to imperfect insertion of the male adapter (which is valid as well when a female adapter is used) is shown in FIG. 10: If the male adapter (105) is inserted off axis (misaligned), its central pin (104) will push the slotted female center conductor pin (106) down. The female pin (106) is screwed into the center conductor (102) and held centered in place by the dielectric washer (103). The washer is fixed vertically (107) in the housing of the slabline. The center conductor (102) is pushed upwards (101); as the center conductor (102) is also fixed horizontally and vertically on the other end of the slabline (108), this means that the center conductor will bend upwards (101) and the small gap (109) between the center conductor and the tuning probe (100) which is of the order of 0.05 to 0.1 mm will change dramatically; the consequence is a change in reflection factor. Every time another adapter is mounted by a different operator the problem may recur. The proposed adapter reduces this uncertainty.

A key component of the alignment adapter is the rotation disc (FIG. 8); it has a knurled surface (81) to allow for easy manual grip; it has a concentric hexagonal opening (80) to catch the male adapters; because the hexagonal bodies of the adapter are submit to manufacturing tolerances and vary slightly from unit to unit and between manufacturers, it is useful to provide for small adjustability: this is done by cutting a narrow vertical slot (82) and insert a tangential screw (83), which catches into an opposite thread (85), allows adjusting the opening (84) and allows the hexagonal hole to slide-fit over the individual male adapter ensuring proper guidance and no play.

Figure 11:
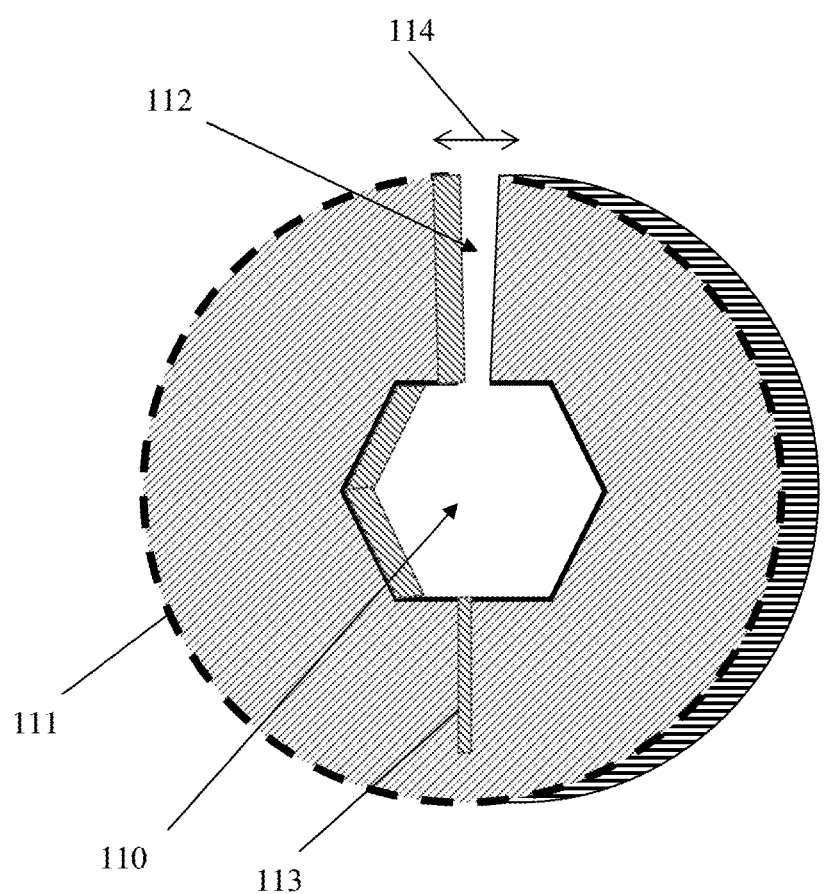
FIG. 11 depicts self-adjusting nylon disc for male adapter body.

In an alternative simplified embodiment the rotation disc is made of elastic (nylon) material (FIG. 11). In that case the adjusting screw (83) in FIG. 8 can be omitted and the slot (112) must be dimensioned such (114) as to allow snug fitting of the hexagonal window (110) over the body of the male adapter (45). The elasticity of the window opening is controlled using the slot (113), which is cut as deep as necessary to leave enough material between the bottom of the slot and the periphery of the disk to generate the required fitting and pressure of the window walls (110) on the adapter body (45).

The present invention discloses two possible embodiments of a generic alignment device allowing controlling precisely the manhandling of RF cables and other components on coaxial connectors of RF instruments, in general, and automatic slide screw impedance tuners in particular, thus avoiding connection repeatability errors. Obvious alternative embodiments, using the same concept, are possible but shall not impede on the validity and generality of the present idea of using an alignment adapter to improve reliability and mostly repeatability of connection operations between cables and instruments and between instruments and components.

What I claim as my invention is:

1. A device for aligning and securing repeatable RF connection between female connector and male adapter of RF instruments and RF components attached to said instruments, comprising support body, adapter capturing disc and cover, whereby the support body is attached and secured on the housing of the instrument and has a central opening allowing access to the coaxial connector of the instrument, and whereby the adapter capturing disc
   a) is sandwiched between and guided by the support body and the cover,
   b) captures the hexagonal cap of the male RF adapter and
   c) is accessible to be rotated by hand, and whereby the cover, which encapsulates and guides the disc, is secured against the support body using fastening screws; and whereby the disc has centered hexagonal opening, which slide-fits over the hexagonal cap of the male adapter of the coaxial connectors.

2. The alignment device as in claim 1 for guiding and controlling the mounting of male adapters on female connectors.

3. The alignment device as in claim 1 for guiding and controlling the insertion of female connectors into male adapters, whereby an additional concentric guidance ring, used to guide the insertion of the female connector barrel, is attached on the cover surface facing the external female connector; and whereby the internal diameter of said ring slide-fits over the thread of the barrel of the female connector.

4. Disc for alignment device as in claim 1 having central hexagonal window with adjustable opening, whereby the dimensions of the window match the dimensions of the hexagonal cap of the male adapter.

5. The disc as in claim 4 comprising a radial slot whose width is controlled by a tangential screw inserted at the periphery of the disc and bridging both walls of the slot.

6. The disc as in claim 5, whereby the adjustment of the slot width allows the hexagonal window to slide-fit over the hexagonal cap of the male adapter.

7. The disc as in claim 4 made of elastic material, having a radial slot, whereby the width of the slot and the adaptability of the hexagonal window opening are optimized and inherently controlled by the thickness of the disc and the elasticity of the material.

8. The alignment device as in claim 1, whereby the RF instrument is automatic electro-mechanical slide screw impedance tuner.

* * * * *